United States Patent [19]
Musser

[11] Patent Number: 4,889,787
[45] Date of Patent: Dec. 26, 1989

[54] LOW GAIN POSITIVE ACTING DIAZO OXIDE PRE-PRESS PROOFING SYSTEM WITH POLYVINYL ETHER AND PARTICULATE SLIP AGENT IN ADHESIVE LAYER

[75] Inventor: Arlene K. Musser, Oakdale, Minn.

[73] Assignee: Minnesota Mining and Manufacturing Company, St. Paul, Minn.

[21] Appl. No.: 185,971

[22] Filed: Apr. 25, 1988

[51] Int. Cl.$^4$ .......................... G03C 1/60; G03C /190
[52] U.S. Cl. ................................. 430/166; 430/143; 430/191; 430/192; 430/293
[58] Field of Search ............... 430/166, 191, 192, 143, 430/293

[56] References Cited

U.S. PATENT DOCUMENTS

| 3,634,082 | 1/1972 | Christensen | 430/192 |
|---|---|---|---|
| 3,634,087 | 1/1972 | Houle et al. | 96/49 |
| 3,671,236 | 3/1968 | Van Beusekom | 96/15 |
| 4,260,673 | 4/1981 | Krech | 430/143 |
| 4,262,071 | 4/1981 | Larson | 430/143 |
| 4,366,223 | 12/1982 | Larson | 430/143 |
| 4,634,652 | 1/1987 | Barton | 430/156 |
| 4,656,114 | 4/1987 | Cederberg et al. | 430/160 |
| 4,659,642 | 4/1987 | Platzer et al. | 430/143 |
| 4,725,526 | 2/1988 | Frass et al. | 430/166 |
| 4,740,451 | 4/1988 | Kohara | 430/194 |

FOREIGN PATENT DOCUMENTS

| 893153 | 2/1972 | Canada. |
| 115899 | 8/1985 | European Pat. Off. . |
| 243932 | 11/1987 | European Pat. Off. . |

Primary Examiner—Charles L. Bowers, Jr.
Attorney, Agent, or Firm—Donald M. Sell

[57] ABSTRACT

A positive-acting photosensitive proofing element is constructed with a thermal adhesive layer having a Tg between 45° C. and 60° C., said adhesive comprising a polymer or copolymer derived from an ethylenically unsaturated monomer and 0.5 to 40% by weight of a polyvinyl ether polymer as a flexibilizer.

8 Claims, No Drawings

LOW GAIN POSITIVE ACTING DIAZO OXIDE PRE-PRESS PROOFING SYSTEM WITH POLYVINYL ETHER AND PARTICULATE SLIP AGENT IN ADHESIVE LAYER

FIELD OF THE INVENTION

This invention relates to a positive acting presensitized colored sheet comprised of a support, an optional release layer, a diazo oxide sensitized color layer and a nonblocking thermoplastic adhesive layer.

BACKGROUND OF THE INVENTION

In color reproduction, it is often necessary to verify the color accuracy of separation negatives and/or positives used in the printing process. This can be accomplished by producing a four or more color proof. There are two main types of color proofs: an overlay proof and a surprint proof. An example of a negative acting overlay proof is described in U.S. Pat. No. 3,136,637. That proofing method is based upon exposing and developing each presensitized color sheet separately and then superimposing the sheet to yield a multicolor composite. This method offers a very simple way of combining two or more colors in registration. However, it has several inherent disadvantages. The multiplicity of plastic sheets cause incident light to internally reflect. This reflection imparts a gloss, a color hue shift and a distortion of the image which is not truly representative of printed copy. U.S. Pat. No. 4,634,652 describes an improved overlay system using a more transparent substrate. However, an optical distortion of the image and subsequent color hue shift still remains due to the large spacing between the colored images.

A surprint proof is generated by successively superimposing different colored layers upon each other on a single sheet. The surprint color proofing materials are composed of two primary types: photosensitive precolored sheets and photosensitive colorless sheets whose latent image may be toned with pigments, inks or dyes. Some examples of post-colored proofing materials may be found in U.S. Pat. Nos. 3,060,024, 3,634,087 and DE No. 3,336,431. In these systems the image is weak and often requires a protective layer. The resultant color hue is also very user dependent due to dependency upon color density control and lot to lot variation of the colorants.

Some examples of precolored proofing materials include constructions based upon both diazo and photopolymers as the photosensitive element. In U.S. Pat. Nos. 4,482,625 and 4,304,836 two different precolored photopolymer constructions are described which are imaged prior to lamination to the substrate or intermediate sheet. A similar system is described in GB No. 2,144,867 A which utilizes precolored films sensitized with diazo based polymers. These systems require the imaged films to be laminated in register which is very dependent upon laminating speed, laminating temperature, and dimensional stability of the film and substrate. The accuracy of the registration is limited to small format proofs. This type of system also makes it very difficult to produce several small proofs on a single large sheet (scatter proofing).

U.S. Pat. Nos. 3,671,236, 4,260,673, 4,650,738, 4,656,114, 4,659,642 and EP No. 0,115,899 A3 describe diazo sensitized precolored constructions which are laminated to the substrate prior to imaging. Each of these systems contain barrier and/or adhesive layers which remain in the final proof, lying between each image layer. The existence of these additional clear layers causes an optical enlargement of the halftone dots better known as optical dot gain. The optical gain in these proofing systems give a reasonable reproduction of the tonal curves for printing presses having dot gains in the 20-30% range. The different dot gains can be obtained by increasing the coating weights of the barrier and/or adhesive layers. U.S. Pat. No. 4,262,071 describes the incorporation of a spacer layer in order to increase the optical dot gain. All of these methods are effective for achieving the higher dot gains. However, it is very difficult to achieve the dot gains in the 14-20% range. EP No. 0,243,932 describes an improved positive working color proofing film and process which claims to be able to reproduce dot gains in this lower range. This system is based upon toning a photopolymer image. Being a toning process it suffers from a lack of reproducibility of the density and lot to lot color variance of the toners. The system described in the EPO No. 243,932 patent application also incorporates optical brighteners which causes metamerism in the final proof.

SUMMARY OF THE INVENTION

The present invention relates to materials and processes used to lower the dot gain in positive acting color pre-press proofing systems. The incorporation of a polyvinyl ether resin in an ethylenically unsaturated polymer adhesive, especially an acrylic resin adhesive and most particularly a styrene/acrylate thermoplastic adhesive allows one to lower the coating weight of the adhesive thus lowering the optical dot gain in the final proof. The thermoplastic adhesive contains a flexibilizer, particularly a polymeric flexibilizers, and most preferably a polyvinyl ether resin which allows the adhesive layer to be coated at low coating weights thus exhibiting lower optical dot gain in the final proof while maintaining good substrate and interlayer adhesion. The lower dot gain pre-press proof gives a more faithful representation of the resultant color prints obtained on commercial printing presses, flatbed proof presses, and positive printing processes in which sharpened plates have been used.

DETAILED DESCRIPTION OF THE INVENTION

The present invention describes a positive surprint proofing system based upon a color proofing sheet comprising at least two layers. One layer is a thermal adhesive layer and the other layer is a colorant containing, positive acting photosensitive layer. Additional layers such as a strippable carrier layer with or without a release coating containing anti-halation components and/or release agents on one face which is in contact with the photosensitive layer and/or a barrier layer separating the photosensitive layer and the adhesive layer may be included in the construction.

The carrier sheet is provided with a release surface which may either be a smooth surface of the carrier itself or a surface coating thereon. The function of release surface is to serve as a parting layer between the carrier sheet and the color layer. The preferred material for use in the present invention is a 2 mil (0.051 mm) polyester film provided with a release layer comprising a cellulose methyl ether or polyvinyl alcohol resin. The carrier sheet and/or release layer may contain anti-halation materials such as those described in EP No. 0 165,030 A.

The photosensitive color layer comprises a base soluble organic polymeric resin binder having an o-quinone diazide or other positive-acting diazo oxide mixed with, dissolved in, or pendant to the binder. The layer also contains a colorant such as a pigment or dye. The diazo oxide must be soluble or otherwise present in amounts of at least 10% by weight in the organic polymeric resin binder. Preferred polymers for this layer are phenolic resins including both resols and novalaks. Base soluble acrylic resins and styrene maleic anhydride half ester copolymers are also useful. Other polymeric materials (such as butvar resin to disperse and hold the colorant) may be dissolved or mixed with the primary resin binder constituent. Epoxy resins may also be mixed or dissolved with the binder to adjust physical properties. Furthermore, crosslinked epoxy or polyurethane resins may be added as may polyisocyanates (or other epoxy resin crosslinking agents) and monoisocyanates to react with the phenolic resin or other polymer constituents.

An optional barrier layer (described in U.S. Pat. No. 4,260,673), whose function is to provide a clean background upon development of the color layer, may be included in the construction. The barrier layer is comprised of a mixture of a phenol formaldehyde novalak resin, which is slightly penetrable by the aqueous alkaline developer and becomes soluble in said developer uon exposure to active light, and a diazo oxide. A preferred barrier layer consists of the reaction product of an alkali-solution of a phenol formaldehyde resin and 2-diazo-1-naphthol-5-sulfonyl chloride. The reaction product has been found to give a greater latitude in the choice of developers because of its resistance to attack.

The adhesive layer is comprised of a thermally activated adhesive which is coated on the top surface of the barrier layer or the photosensitive color layer. The coating thickness of this layer has a direct correlation to the dot gain obtained in the final color proof. In order to reduce the optical gain in the final proof the thickness of this layer must be minimized. In attempting to minimize the coating thickness of this layer, significant problems were encountered. Amongst the problems encountered were (1) the lamination quality to an intermediate, underlying colored images and previously laminated adhesive layers or the final substrate, (2) the internal adhesion between the color and adhesive layers, (3) the flexibility of the adhesive coating, (4) blocking resistance under storage and transportation cond. such as 50° C. and 2g/cm² pressure, (5) toning of pigment and other colored materials into the adhesive layer and (6) yellowing of the adhesive layer when exposed to actinic radiation, particularly ultraviolet radiation.

The adhesive layer is primarily composed of a thermoplastic resin derived from ethylenically unsaturated monomers (and copolymerizable comonomers) which resin is softenable at a temperature of less than 200° C., preferably within a range between 100° C. and 160° C. In contrast with the softening characteristics of the adhesive it must also not block during storage or shipment. Resins having a Tg between 45° C. and 60° C., including copolymers of acrylic and/or methacrylic monomers with styryl monomers, meet both the lamination criteria and avoid the potential for blocking, without requiring use of an additional protective liner. Useful polystyryl acrylate copolymers non-exclusively include Pliolite™ AC, Pliolite™ TM AC-L, Pliolite™ AC-80, Pliolite™ AMAC, Pliolite™ AMAC-L, Pliolite™ VTAC, Pliolite™ VTAC-L ad mixtures thereof, available from Goodyear. A 50/50 butylmethacrylate styrene copolymer has also been useful. These resins have superior resistance to UV and thermal degradation unlike other thermoplastic resins i.e. copolymers of butadiene, vinylidene chloride, vinyl chloride and vinyl acetate. The incorporation of acrylate and/or methacrylate copolymers into the adhesive layer improves the internal adhesion between the adhesive layer and photosensitive color layer thus allowing the adhesive to be coated at lower coating weights without seriously affecting the lamination quality of the adhesive to the substrate or the preceding image and maintaining integrity of the film layers during the proof making process. The styrene/acrylate resins having a Tg between 45° C. and 60° C. form brittle films when formulated by themselves. In order to flexibilize the layer it was found that the incorporation of plasticizers and/or a soft resin was useful. The phthalate and phosphate plasticizers (i.e. Santicizer™ 278, Santicizer™ 148 and Santicizer 160 available from Monsanto Corp.) generally are very useful as flexibilizers. However, there is a tendency for the pigments to tone into the adhesive layer when the adhesive containing these plasticizers is coated directly onto the color layer. The preferred flexibilizers include polyvinyl ethers, i.e. Gantrez™ M555 (GAF) and Lutonal™ M40 (BASF) which do not extract the pigment out of the color layer.

A polyvinyl ether resin is a polymeric material well understood in the art. It comprises a polymer having at least twenty percent of all of its units comprised of units of the formula

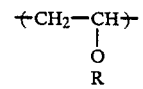

wherein R is an alkyl of 1 to 4 carbon atoms (methyl, ethyl, propyl or butyl, preferably methyl or ethyl). Generally the preferred polymers comprise at least 35% of its units of that formula. More preferably at least 50% of the polymer comprises such units and most preferably at least 70% up to 100%. The remainder of the units comprising units derived from ethylenically unsaturated monomers copolymerizable with the vinyl ether monomers. Such polymers include olefinic and acrylic comonomers.

In order to give the materials more slip, silica or polyethylene can be incorporated into the adhesive formulation. Slip agents which are useful non-exclusively include Cab-o-sil™ from Cabot, Syloids™ from Grace, and Polysilks™ from Micro Powders Inc. The addition of 0.05%–1.0%, preferably 0.1%–0.5%, of the slip agent prevents the sheets from blocking in storage or shipment and also allows the sheets to slide over each other more readily thus making it easier to pull individual sheets out of a stack during normal handling.

The adhesive composition will generally comprise at least 50% by weight of an acrylic or methacrylic polymer or copolymer (inclusive of terpolymers, etc.) and 0.5 to 50% (preferably 0.5 to 40%, more preferably 2 to 35%) of the plasticizer. 0.05 to 1% particulate slip agents are prepared as is the use of acrylic or methacrylic copolymers with at least 4% by weight of the polymer being styrl units.

EXAMPLES

The examples described below outline the procedures for the production of materials and construction of a four color proof.

The release layer is coated first at a dry coating weight of 0.75–1.0 g/m² onto a 2 mil (0.051 mm) polyethylene terephthalate polyester carrier film. A typical release layer formulation would include the following:

| | |
|---|---|
| Deionized water | 33.1 kg |
| Gelvatol TM 20/30 polyvinyl alcohol | 2758.0 g |
| Gelvatol TM 20/90 polyvinyl alcohol | 919.0 g |
| Triton TM X-100 surfactant | 110.0 g |

The release layer is then overcoated with a photosensitive color solution which is prepared in two stages. A millbase is prepared first followed by the actual photosensitive color solution. Typical millbase formulations would include the following:

| | |
|---|---|
| Magenta Millbase | |
| Modified Resinox [reaction product of Resinox RS 7280 (Monsanto) and 3% by weight of DDI-1410 diisocyanate (Hendel)] a 29.2% solids solution in MEK | 1360 g |
| Butvar TM B-76, polyvinyl butyral resin (Monsanto) | 43 g |
| Watchung Red Pigment 698-D | 170 g |
| Cabot Regal Black Pigment 300R | 2 g |
| Additional Modified Resinox | 1360 g |
| Cyan Millbase | |
| Modified Resinox | 1089 g |
| Butvar TM B-76 | 43 g |
| Monastral Blue BT-297-D pigment | 116 g |
| Monastral Blue BT-284-D pigment | 55 g |
| Additional Modified Resinox | 1089 g |
| Yellow Millbase | |
| Modified Resinox | 1117 g |
| Butvar TM B-76 | 15 g |
| Diarylide Yellow 275-0562 | 60 g |
| Black Millbase | |
| Modified Resinox | 570 g |
| Butvar TM B-76 | 23 g |
| Cabot Regal Black 300R | 92 g |
| Additional Modified Resinox | 677 g |

Typical photosensitive color coating solutions would include the following:

| | |
|---|---|
| Magenta coating solution | |
| Magenta millbase diluted to 31% T.S. with MEK | 1335 g |
| Benzophenone bis diazo oxide | 84 g |
| MEK | 1330 g |
| Cyan coating solution | |
| Cyan millbase diluted to 30% T.S. with MEK | 835 g |
| Benzophenone bis diazo oxide | 76 g |
| MEK | 1035 g |
| Yellow coating solution | |
| Yellow millbase diluted to 30% T.S. with MEK | 870 g |
| Benzophenone bis diazo oxide | 52 g |
| MEK | 1049 g |
| Black coating solution | |
| Black millbase diluted to 30% T.S. with MEK | 835 g |
| Benzophenone bis diazo oxide | 76 g |
| MEK | 1035 g |

Each of the color solutions were coated onto the previously coated release layer to a reflectance density appropriate for a good overall color rendition in the final proof. One skilled in the art will appreciate the necessity of adjusting the various components of the color layer so as to obtain the desired exposure time and color hue with each pigment system.

An optional barrier layer having a coating weight of 0.2–0.3 g/m² may be included in the construction. A typical formulation for the barrier layer would include the following:

Reaction product of Resinox TM RS 7280 and
Diazo oxide [Naphthoquinone-(1,2)-diazido-(2)-5-sulfonyl chloride]
Isopropanol The final adhesive layer is coated at a dry coating weight of 2.7 g/m². A typical adhesive coating solution would include the following:

| | |
|---|---|
| Pliolite TM AC, styrene/acrylate copolymer | 1073.5 g |
| Gantrez TM M555, polyvinyl methyl ether | 56.5 g |
| Syloid TM 378 (silica) | 2.8 g |
| Toluene | 7990.4 g |

The following table lists the dot gains observed at the 40% dot value for each of the four colors in a four color proof. The whiteness or brightness of the base also influences the dot gains observed therefore included in this table are two representative paper substrates useful in comparing prepress proofs to a print generated on a typical commercial printing press.

| | DOT GAIN AT 40% DOT VALUE | | | | |
|---|---|---|---|---|---|
| | Micro Line | Cyan | Magenta | Yellow | Black |
| Match-print TM II | 4 | 22(22) | 22(20.5) | 21(17.5) | 20(20) |
| | 15 | 18(17) | 19(16) | | |
| Commercial Base | 10 | | | | 20(14) |
| | 12 | | | | 18(16.5) |
| Match-print TM II | 4 | 19(19.5) | 20(18.5) | 19(16) | 17(17) |
| | 12 | 16(16) | 17(14) | | |
| Low Gain | 8 | | | 19(13) | |
| Commercial Base | 10 | | | | 14(14) |

*Numbers outside the parentheses were generated by a Gretag densitometer equipped with SPI Narrow Band Filters. Numbers in the parentheses were generated by an X-rite densitometer equipped with wider-band status T filters.

In these examples, the following polymeric materials were used. This shows that both copolymers and blends of polymer can be used as the thermal adhesive in the present invention as long as the Tg is within the required range. The table shows the need for the flexibilizer of the present invention and the usefulness of the particulates for antiblocking effects.

| Polymer | Polymer Class | Trade Name |
|---|---|---|
| A | styrene-acrylate | Pliolite ® AMAC |
| B | methylmethacrylate-butylmethacrylate | Acryloid B-67 |
| C | styrene-acrylate | Pliolite AC-80 |
| D | olefinic resin | Kristalex 3086 |
| E | Monomeric Hydrocarbon resin | Piccotex 75 |
| F | polyacrylate | Elvacite 2044 |
| G | | Floral 85 |
| H | polyester | Atlac 387 |
| I | polyvinyl ether | Gantrez 555 |
| J | polyvinyl ether | Gantrez 556 |
| K | sulfonamide | Santicizer 8 |

The various resins and resin compositions were coated as adhesive layers and their brittleness and blocking properties evaluated. Where indicated as blocking, higher values indicate worse performance (more sticking between sheets). Higher values for brittleness also indicated a poorer performance. Si and Syl are commercially available silica particles used as slip agents in the composition. The following resins were coated at 25% T.S. in Naphtha VM&P onto PVA coated polyester:

| Resin | Brittleness | Blocking |
|---|---|---|
| 100% A | 5.0 | 1.0 |
| 100% B | 5.0 | 2.0 |
| 100% C | 4.5 | 4.0 |
| 25% C/75% B | 5.0 | 1.0 |
| 50% C/50% B | 5.0 | 1.0 |
| 75% C/25% B | 5.0 | 2.0 |
| 25% A/75% B | 5.0 | 1.0 |
| 50% A/50% B | 5.0 | 2.0 |
| 75% A/25% B | 5.0 | 2.0 |

The following resins were coated at 25% T.S. in Toluene onto PVA coated polyester:

| Resin | Brittleness | Blocking |
|---|---|---|
| 100% D | 6.0 | 2.0 |
| 100% E | 3.0 | 1.0* |
| 50% D/50% C | 5.0 | 1.0 |
| 50% D/50% B | 6.0 | 1.0 |
| 50% D/50% C | 6.0 | 2.0 |
| 50% D/50% C | 6.0 | 1.0 |
| 50% D/50% B | 5.0 | 4.0 |
| 50% D/50% C | 6.0 | 1.0 |
| 50% B/50% F | 5.0 | 6.0 |
| 50% B/50% G | 5.0 | 6.0 |
| 90% B/10% H | 3.5 | 6.0 |
| 50% C/50% F | 1.0 | 6.0 |
| 50% C/50% G | 5.0 | 6.0 |
| 90% C/10% H | 0.5 | 6.0 |
| 50% D/50% F | 1.0 | 6.0 |
| 50% D/50% G | 6.0 | 4.5 |
| 90% D/10% H | 0.5 | 5.0 |
| 90% C/10% Santicizer 8 | 0.0 | 6.0 |
| 90% C/10% I | 0.0 | 6.0 |
| 90% C/10% J | 0.0 | 6.0 |
| 95% c/5% K | 0.5 | 5.5 |
| 95% AC-80/5% L | 0.5 | 5.5 |
| 95% C/5% J | 0.5 | 5.5 |
| 95% C/5% K + .10 Si | 0.5 | 5.0 |
| 95% C/5% I + .10 Si | 0.5 | 3.0 |
| 95% C/5% J + .10 Si | 0.5 | 3.0 |
| 95% D/5% I + .5% Syl | 5.0 | 5.5 |
| 95% C/5% I + 1% Syl | 0.0 | 1.0 |
| 95% D/5% I + 1% Syl | 5.0 | 5.5 |

One method for obtaining a multicolored color proofing sheet image on one substrate would include the following steps:

(1) bonding the adhesive layer of a first presensitized sheet to a substrate;

(2) removing said carrier sheet; (optional)

(3) exposing said presensitized sheet through a color separation positive corresponding to the pigment of said color coating to actinic radiation whereby the exposed diazo oxide containing resin of said barrier layer and diazo oxide of said color coating are rendered soluble in an alkaline solvent developing medium to create a latent image;

(4) developing said image with an alkaline solvent developing medium whereby exposed diazo containing resin in said barrier layer and associated diazo oxide containing color coating is removed and unexposed diazo oxide and diazo oxide containing resin in said barrier layer and color coating remains;

(5) bonding the adhesive layer of an additional presensitized sheet having a different color pigment in said color coating to the developed first presensitized sheet;

(6) repeating steps 2-4 with a subsequent separation positive being in register with said developed first presensitized sheet; and (7) repeating steps 5 and 2-4 in that order with additional presensitized sheets being of a different color, whereby there is provided said multi-colored proofing sheet on one substrate.

Other methods which are useful for construct a multicolored proofing sheet are described in U.S. patent application Ser. No. 100,603 filed Sept. 24, 1987 in the name of Wallace R. Lundquist et al. and U.S. Pat. No. 4,659,642.

I claim:

1. A positive acting photosensitive proofing element comprising:
   (A) a strippable carrier,
   (B) a positive acting photosensitive layer comprising a base soluble organic polymeric resin binder having a positive-acting diazo oxide mixed with, dissolved in, or pendant to said binder, said layer containing sufficient colorant therein to provide a reflection optical density of at least 0.8 and
   (C) a thermoplastic thermal adhesive layer, said adhesive layer being present at a weight of between 1.0 g/m$^2$ and 3.2 g/m$^2$ having a Tg between 45 and 60° C., and said adhesive layer comprising by weight of solids:
   (a) an acrylic copolymer with styrene,
   (b) 0.05 to 1.0% particulate slip agents,
   (c) at least 4% by weight of said styrene copolymer units, and
   (d) at least 2-35% by weight of a polyvinyl ether polymer flexibilizer.

2. The element of claim 1 wherein said photosensitive layer comprises a polymeric binder containing from 10 to 70% by weight of a diazo oxide positive acting photosensitizer.

3. The element of claim 1 wherein said polyvinyl ether polymer comprises from 2 to 20% by weight of said thermoplastic adhesive layer and said adhesive layer has a Tg between 45° and 60° C.

4. The element of claim 2 wherein a barrier layer is present between said photosensitive layer and said adhesive layer which prevents migration of colorant into said adhesive layer.

5. The element of claim 3 wherein a barrier layer is present between said photosensitive layer and said adhesive layer which prevents migration of colorant into said adhesive layer.

6. The element of claim 4 wherein a strippable carrier layer is in contact with said photosensitive layer.

7. The element of claim 5 wherein a strippable carrier layer is in contact with said photosensitive layer.

8. The element of claim 7 wherein 0.05 to 1% of particulate slip agents are present in said thermoplastic adhesive layer.

* * * * *

UNITED STATES PATENT AND TRADEMARK OFFICE
CERTIFICATE OF CORRECTION

PATENT NO. : 4,889,787

DATED : December 26, 1989

INVENTOR(S) : Musser

It is certified that error appears in the above-identified patent and that said Letters Patent is hereby corrected as shown below:

Claim 1, column 8, line 37, "at least" should be deleted before the numbers "2-35%".

Signed and Sealed this

Seventh Day of May, 1991

Attest:

HARRY F. MANBECK, JR.

Attesting Officer      Commissioner of Patents and Trademarks